(12) United States Patent
Liu

(10) Patent No.: US 7,045,902 B2
(45) Date of Patent: May 16, 2006

(54) CIRCUITIZED SUBSTRATE FOR FIXING SOLDER BEADS ON PADS

(75) Inventor: Sheng-Tsung Liu, Kaohsiung (TW)

(73) Assignee: Advanced Semiconductor Engineering, Inc., Kaohsiung (TW)

(*) Notice: Subject to any disclaimer, the term of this patent is extended or adjusted under 35 U.S.C. 154(b) by 25 days.

(21) Appl. No.: 10/964,760

(22) Filed: Oct. 15, 2004

(65) Prior Publication Data

US 2005/0082686 A1   Apr. 21, 2005

(30) Foreign Application Priority Data

Oct. 17, 2003   (TW) .............................. 92128932 A

(51) Int. Cl.
 H01L 23/48   (2006.01)
 H01L 29/40   (2006.01)
 H01L 23/52   (2006.01)
 H05K 1/14    (2006.01)
 H05K 7/02    (2006.01)
 H01R 12/04   (2006.01)

(52) U.S. Cl. .................... 257/780; 257/779; 174/261; 361/743; 361/767; 361/772; 361/808

(58) Field of Classification Search .................... None
See application file for complete search history.

(56) References Cited

U.S. PATENT DOCUMENTS

| | | | | |
|---|---|---|---|---|
| 5,453,581 A | * | 9/1995 | Liebman et al. ............ | 174/261 |
| 5,838,070 A | * | 11/1998 | Naruse et al. .............. | 257/779 |
| 6,060,778 A | * | 5/2000 | Jeong et al. ................. | 257/710 |
| 6,259,608 B1 | * | 7/2001 | Berardinelli et al. ........ | 361/777 |
| 6,657,133 B1 | * | 12/2003 | Chee ........................... | 174/260 |
| 6,667,557 B1 | * | 12/2003 | Alcoe et al. ................. | 257/778 |
| 6,707,680 B1 | * | 3/2004 | Schaper ....................... | 361/760 |
| 6,959,489 B1 | * | 11/2005 | Beroz et al. .................. | 29/840 |

FOREIGN PATENT DOCUMENTS

TW   472367   1/2002

* cited by examiner

*Primary Examiner*—David Nelms
*Assistant Examiner*—Earl Taylor
(74) *Attorney, Agent, or Firm*—Troxell Law Office, PLLC

(57) ABSTRACT

A circuitized substrate has contact pads for mounting a Surface Mount Device (SMD). First and second contact pads are located on a surface of the substrate corresponding to a first terminal and a second terminal of the SMD. The first and the second contact pads have a plurality of expanded portion or diminished portions to form bead receptacles at the facing corners thereof. When solder paste is reflowed to electrically connect the SMD, solder beads formed from the solder paste can be fixed on the bead receptacles. Therefore, there is no free solder bead on the substrate causing short circuit for semiconductor packages.

22 Claims, 4 Drawing Sheets

CIRCUITIZED SUBSTRATE FOR FIXING SOLDER BEADS ON PADS

FIELD OF THE INVENTION

The present invention generally relates to a circuitized substrate for mounting a SMD (Surface Mount Device), more particularly to a circuitized substrate having improved contact pads for fixing the solder beads for semiconductor packages.

BACKGROUND OF THE INVENTION

SMD (Surface Mount Device), such as passive components selected from resistors, inductors or capacitors, are mounted on the contact pads of a circuitized substrate like printed circuit board or ceramic substrate. Recently, more and more components and SMD's are requested to mount on a chip-carrying substrate especially for Multi-Chip Package/Module, Chip Scale Package, or System-In-Package. However, the substrate has a limited area for SMD's. Generally, solder paste serves as an electrical connection agent for mounting SMD on the contact pads of a substrate. The solder paste will be pressed by the SMD and caused uncontrollably flow of solder paste on the contact pads during reflowing. After reflowing, the remains of solder paste can be easily condensed and formed solder beads due to the large surface tension of solder. The solder beads will be free to move about on the substrate, resulting in severe contamination, moreover, electrical problems.

Referring to FIG. 1, a conventional circuitized substrate 10 includes a first contact pad 20 and a second contact pad 30 for mounting a SMD 40. Normally the contact pads 20 and 30 are square and close to each other so as to connect with the first terminal 41 and the second terminal 42 of the SMD 40 respectively. Referring to FIG. 2 and 3, the first contact pad 20 and the second contact pad 30 are exposed out of solder mask openings 12. Solder paste 50 is applied on the first contact pad 20 and the second contact pad 30. When the SMD 40 is mounted on the circuitized substrate 10, solder paste 50 is reflowed to assure good electrical connection between the first terminal 41 and the first contact pad 20 and between the second terminal 42 and the second contact pad 30. The remains of solder pastes 50 under a pressure may be extruded out of the SMD 40 toward the corners of the first contact pad 20 and the second contact pad 30. Therefore, tiny solder beads 51 can easily form after reflowing the solder paste 50. The solder beads 51 are formed at the right-angled or acute-angled corners 21, 31 or randomly on the solder mask, and can easily move about on the substrate 10 due to poor adhesion of solder beads 51 to the solder mask which will cause electrical problems.

A conventional contact pad design for passive components is disclosed in R.O.C. Taiwan Patent publication No. 472,367. The solder mask has a radial-shaped opening and a plurality of grooves extending outward on a contact pad for connecting a SMD. The fin-shaped grooves are used to disperse solder paste to avoid formation of solder beads. However, the solder beads are formed unpredictably due to the variation of the mounting pressure of SMD and the quantity of solder paste applied. Once the solder beads are formed in the above-mentioned fin-shaped grooves, the solder beads cannot be easily bonded to the slender and acute-angled grooves which leads to short circuit. When the substrate is heated during the following processes such as high temperature molding for semiconductor packages, the solder beads will be melted and flowed back to the center of the contact pad. The SMD will become floating and can be easily swept by a molding flow. Thus, it is not good to manufacture a semiconductor package using such a substrate as a chip carrier. Besides, the solder mask with radial opening and metal contact pads are difficult to manufacture.

SUMMARY

The primary object of the present invention is to provide a circuitized substrate having the capacity to control the location and the growth of solder beads. The paired contact pads on a substrate are expanded or diminished to form a plurality of bead receptacles at the facing corners thereof. When solder paste used for connecting a SMD is reflowed, the solder beads formed from solder paste can be fixed on the bead receptacles near the SMD. Therefore the circuitized substrate offers a better bonding strength for the SMD by fixing the solder beads for semiconductor packages.

The secondary object of the present invention is to provide a semiconductor package with a SMD on a circuitized substrate. The SMD is mounted on the paired contact pads of the circuitized substrate by means of solder paste. The contact pads have a plurality of bead receptacles at the facing corners thereof so as to fix solder beads formed from solder paste near the SMD. The solder beads can be sealed by an encapsulant.

According to the present invention, a circuitized substrate having paired contact pads for mounting a SMD, such as passive component selected from resistor, inductor, and capacitor. The SMD has a first terminal and a second terminal. The circuitized substrate mainly includes a substrate and a pair of contact pads. The paired contact pads are located on a surface of the substrate for connecting the first and second terminals of the SMD by means of reflowing solder paste. Each contact pad has at least a bead receptacle at the facing corner to fix solder beads formed from the reflowed solder paste. Therefore the bead receptacles can control the location of the solder beads and enhance the growth of the fixed solder beads on the corners of the contact pads.

DETAILED DESCRIPTION OF THE PRESENT INVENTION

Figure 1:
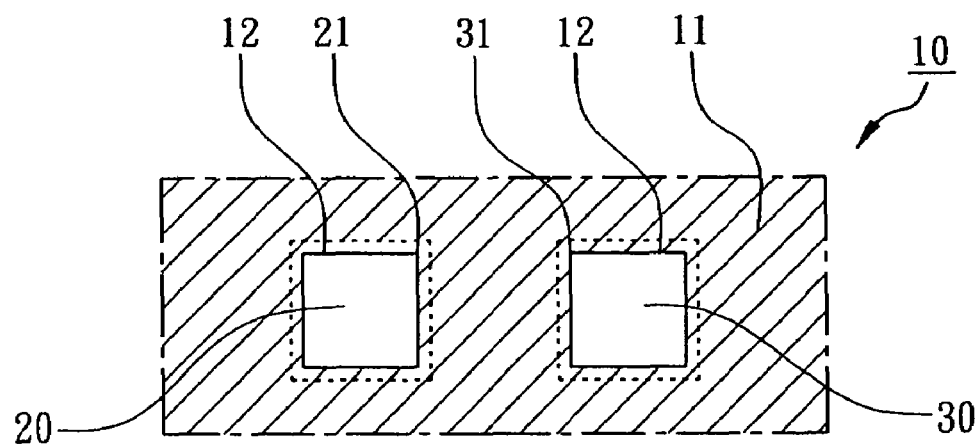
FIG. 1 is a top view of a conventional circuitized substrate having contact pads.
Figure 2:
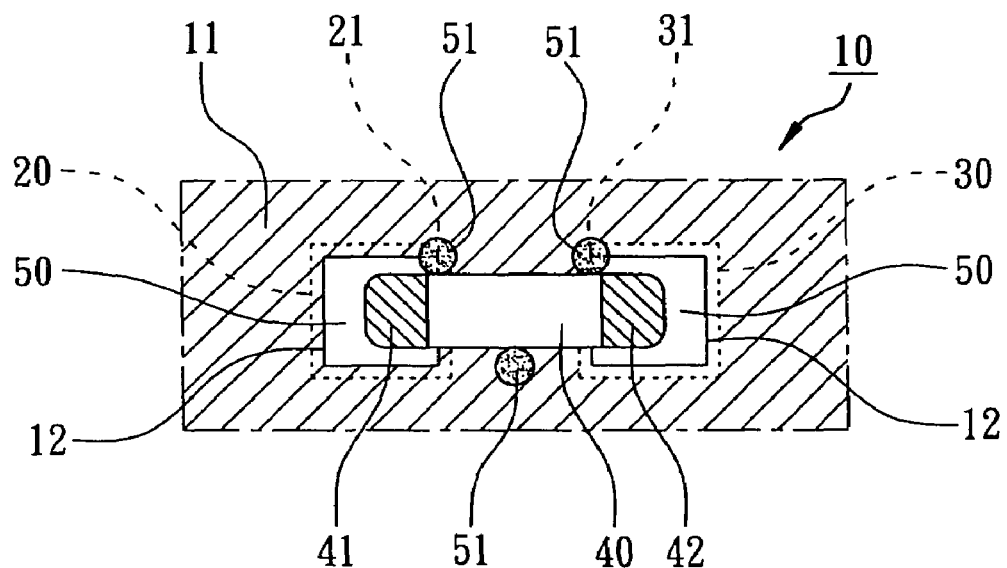
FIG. 2 is a top view of the conventional circuitized substrate mounting with a SMD.
Figure 3:
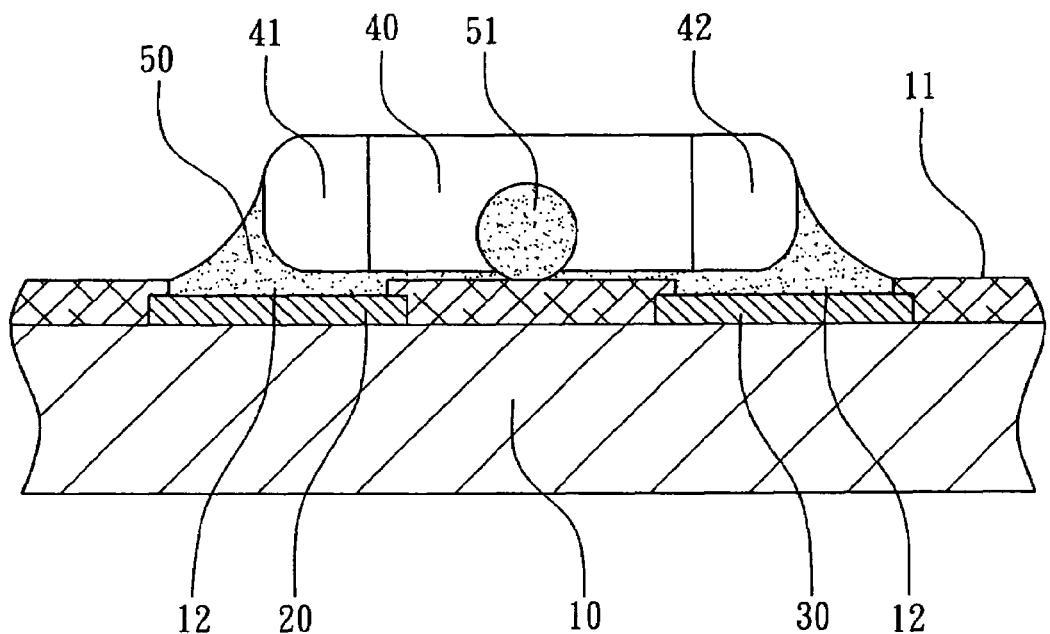
FIG. 3 is a cross-sectional view of the conventional circuitized substrate and the SMD.

Referring to the drawings attached, the present invention will be described by means of the embodiment(s) below.

Figure 4:
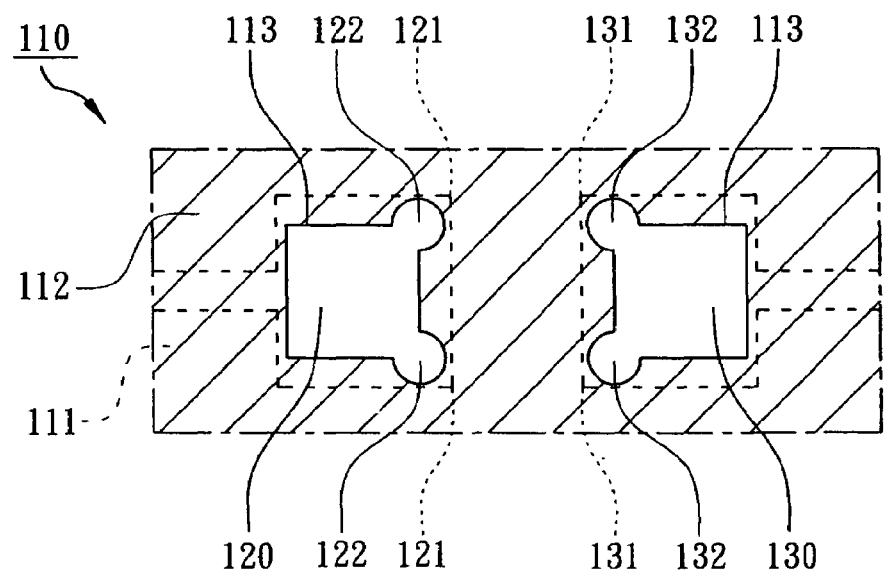
FIG. 4 is a top view of a circuitized substrate having contact pads for fixing solder beads in accordance with the first embodiment of the present invention.
Figure 5:
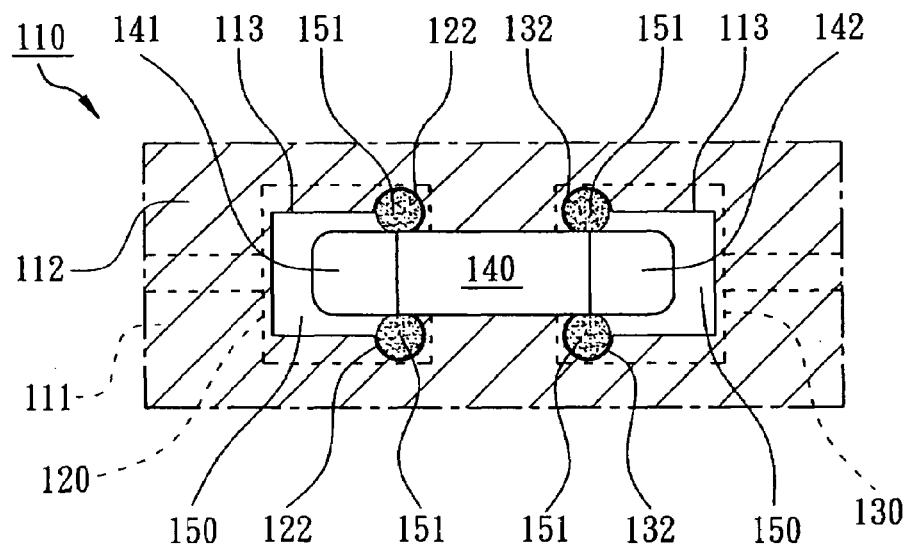
FIG. 5 is a top view of the circuitized substrate mounting with a SMD in accordance with the first embodiment of the present invention.
Figure 6:
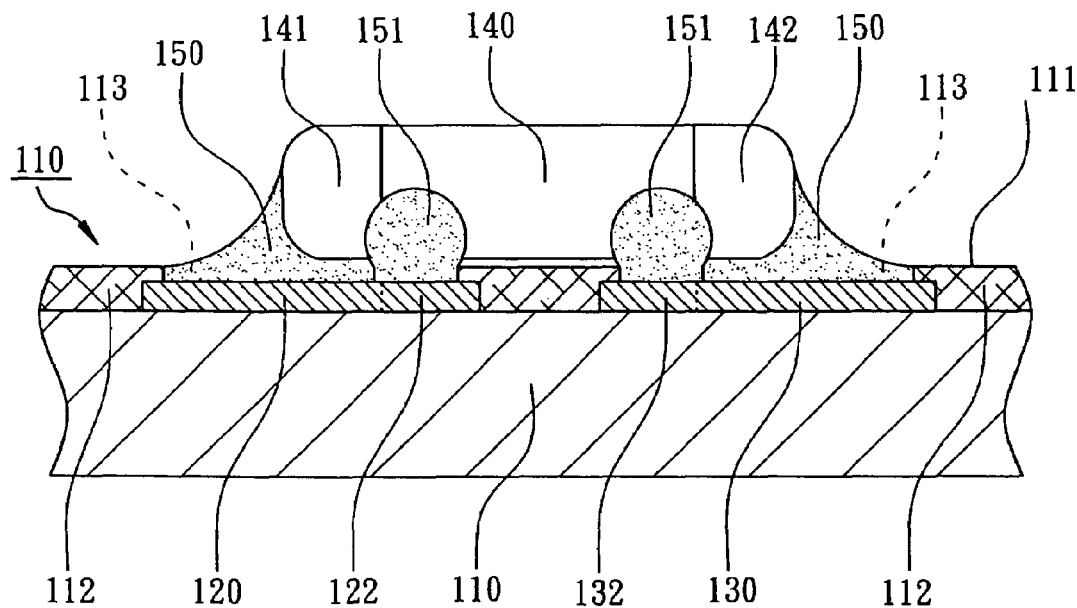
FIG. 6 is a cross-sectional view of the circuitized substrate and the SMD in accordance with the first embodiment of the present invention.

In the first embodiment of the present invention, as shown in FIGS. 4, 5 and 6, a circuitized substrate is provided for fixing solder beads 151. The circuitized substrate has a plurality of paired contact pads for mounting a SMD 140 (surface mount device), a first contact pad 120 and a corresponding contact pad 130 are illustrated in this embodiment. The SMD 140 may be a passive component selected from the group consisting of resistor, inductor, or capacitor. Referring to FIGS. 5 and 6 again, the SMD 140 has a first terminal 141 and a second terminal 142. The circuitized substrate includes a substrate 110, a first contact pad 120, and a second contact pad 130. Preferably, the circuitized substrate is a chip carrier for semiconductor packages, which has at least a layer of wiring pattern, such as a printed circuit board, a ceramic circuit board, a wiring film, a semiconductor substrate, or even a wafer. The substrate 110 has a surface 111 as component-mounted surface. The first contact pad 120 and the second contact pad 130 are formed on the surface 111 of the substrate 110 and each has a shape modified from a rectangle or a square. In this embodiment, the first contact pad 120 has two facing corners 121 and two opposing apo-corners. The second contact pad 130 also has two facing corners 131 and two opposing apo-corners. The facing corners 121 of the first contact pad 120 are adjacent to the second contact pad 130. The facing corners 131 of the second contact pad 130 are adjacent to the first contact pad 120. As shown in FIG. 4, the first contact pad 120 and the second contact pad 130 can be expanded or diminished to form a plurality of bead receptacles 122, 132 at the facing corners 121,131 thereof respectively. However, the apo-corners of the first contact pad 120 and the second contact pad 130 may be in normal shapes without the bead receptacles design. The bead receptacles 122, 132 can be rounded parts of the contact pads 120, 130. Each of the bead receptacles 122, 132 has a tapered opening toward the center of the corresponding contact pads 120, 130 which is less than the diameter of the bead receptacles 122, 132. Usually the bead receptacles 122, 132 have round edges which are more than one-half of a circle for fixing the solder beads 151 formed from the reflowed solder pastes 150, preferably, each round edge is about three-fourth of a circle. The space between two bead receptacles 122 of the first contact pad 120 should be slightly larger than the width of the first terminal 141, and also the space between two bead receptacles 132 of the second contact pad 130 should be slightly larger than the width of the second terminal 142 respectively. In this embodiment, the first contact pad 120 and the second contact pad 130 are Solder-Mask-Defined pads. Also, the bead receptacles 122, 132 are formed by openings of a solder mask 112 to diminish the contact pad 120, 130.

The solder mask 112, a wafer passivation layer or a cover layer, is further formed over the surface 111 of the substrate 110. The solder mask 112 has a plurality of openings 113 to expose the first contact pad 120 and second contact pad 130. In this embodiment, as shown in FIG. 4, each opening 113 of the solder mask 112 includes a plurality of round notches at the facing corners of the first contact pad 120 and the second contact pad 130, so as to define the bead receptacles 122, 132.

Referring to FIGS. 5 and 6, solder paste 150 is applied on the first contact pad 120 and the second contact pad 130 in order to mount the SMD 140 on the substrate 110. The first terminal 141 and the second terminal 142 of the SMD 140 are pressed to contact the solder paste 150 on the first contact pad 120 and on the second contact pad 130. The pressure for mounting the SMD 140 and the quantity of the solder paste 150 can be set in a flexible range since the extra solder paste 150 can be reflowed to form the fixed solder beads 151 on the bead receptacles 122, 132. The bonding strength of the solder beads 151 can be as strong as or better than that of the SMD 140 on the first and second contact pads 120,130. The effect of bead receptacles 122, 132 for the solder beads 151 is good, especially for encapsulating semiconductor packages. Moreover, the locations of the solder beads 151 are adjacent to the sides of the SMD 140 to further secure the SMD 140. For a semiconductor package, a chip is disposed on the circuitized substrate by wire-bonding connection or flip-chip bonding, and an encapsulant seals the chip, the SMD 140 and the solder beads 151 (not shown in Figures). When the encapsulant is formed by molding, the solder beads 151 are fixed by the bead receptacles 122, 132 without causing any electrical problem of short circuit.

According to the circuitized substrate of the present invention, the SMD 140 and at least a chip can be mounted on the surface 111 of the substrate 110 and then encapsulated for manufacturing a semiconductor package. The solder beads 151 may be formed from the reflowed solder pastes 150 and are fixed by the bead receptacles 122, 132. The solder beads 151 are adjacent to the sides of the SMD 140 that enables the SMD 140 to have a better bonding strength and orientation. The SMD 140 will not easily be swept by a mold flow during high temperature molding processes. Therefore, the circuitized substrate is excellent and outstanding as a chip carrier for semiconductor packages, the encapsulant formed by molding can be conveniently formed on the surface 111 of the substrate 110 to seal the SMD 140 and the chip together.

Figure 7:
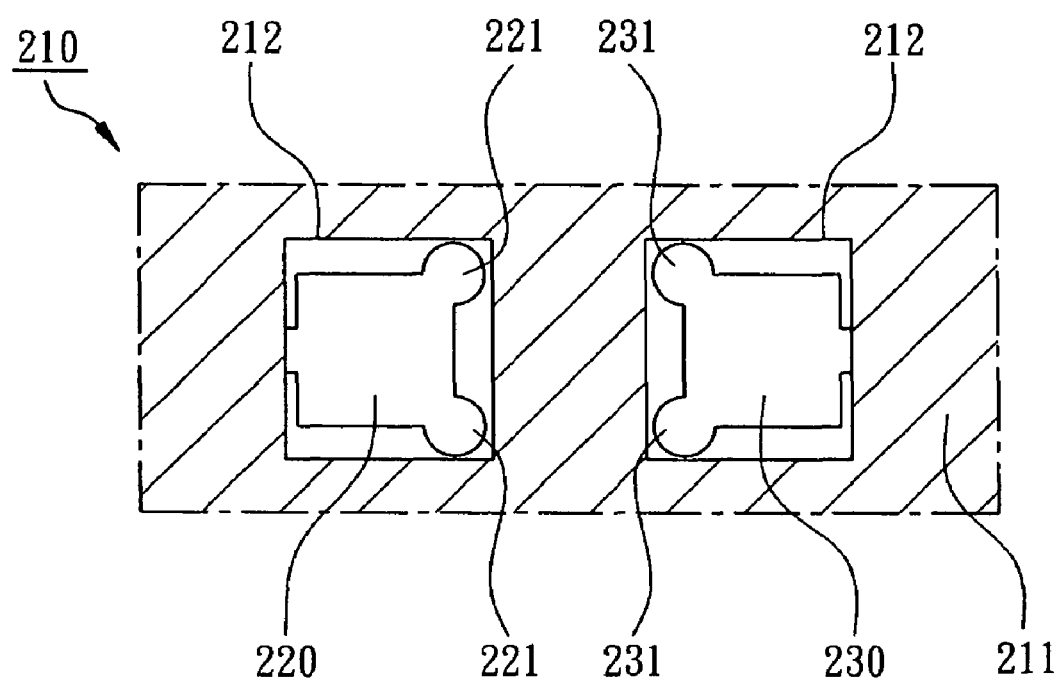
FIG. 7 is a top view of a circuitized substrate having contact pads for fixing solder beads in accordance with the second embodiment of the present invention.

In second embodiment, a circuitized substrate is illustrated as shown in FIG. 7. A first contact pad 220 and a second contact pad 230 are located on a substrate 210 respectively and are expanded to form a plurality of bead receptacles 221 and 231 at the facing corners thereof. A solder mask 211 is formed on the substrate 210. In this embodiment, the openings 212 of the solder mask 211 are larger than the first contact pad 220 and the second contact pad 230 to completely expose the first contact pad 220, the second contact pad 230 and the bead receptacles 221, 231. Thus, the first contact pad 220 and the second contact pad 230 are Non-Solder-Mask Defined pads (NSMD pad) with the capability of fixing the solder beads. The location of the fixed solder beads can be expected and the growth of the fixed solder beads can be enhanced helpful for semiconductor packages.

While the present invention has been particularly illustrated and described in detail with respect to the preferred embodiments thereof, it will be clearly understood by those skilled in the art that various changed in form and details may be made without departing from the spirit and scope of the present invention.

What is claimed is:

1. A circuitized substrate for mounting a surface mount device (SMD) having a first terminal and a second terminal, the circuitized substrate comprising:

a substrate having a surface;

a first contact pad and a second contact pad located on the surface of the substrate for connecting the first terminal and the second terminal of the SMD, wherein the first contact pad has at least a first corner adjacent to the second contact pad, the second contact pad has at least a second corner adjacent to the first contact pad; and a solder mask over the surface of the substrate;

wherein the solder mask has a plurality of openings, each has a plurality of notches at the first and second corners of the first and second contact pads such that the first and second contact pads have a plurality of bead receptacles.

2. The circuitized substrate in accordance with claim 1, wherein the bead receptacles have round edges defined by the notches which are more than one-half of a circle.

3. The circuitized substrate in accordance with claim 1, wherein the bead receptacles have round edges defined by the notches which are about three-fourth of a circle.

4. The circuitized substrate in accordance with claim 1, wherein each of the bead receptacles has a tapered opening toward the center of the corresponding first and second contact pads, the width of tapered opening is less than the diameter of the bead receptacles.

5. A circuitized substrate for mounting a surface mount device (SMD) having a first terminal and a second terminal, the circuitized substrate comprising:
 a substrate having a surface; and
 a first contact pad and a second contact pad located on the surface of the substrate for connecting the first terminal and the second terminal of the SMD, wherein the first contact pad has at least a first corner adjacent to the second contact pad, the second contact pad has at least a second corner adjacent to the first contact pad;
 wherein the first and second contact pads are expanded to form a plurality of bead receptacles at the first and second corners of the first and second contact pads.

6. The circuitized substrate in accordance with claim 5, wherein the bead receptacles have round edges which are more than one-half of a circle.

7. The circuitized substrate in accordance with claim 5, wherein the bead receptacles have round edges which are about three-fourth of a circle.

8. The circuitized substrate in accordance with claim 5, further comprising a solder mask over the surface of the substrate.

9. The circuitized substrate in accordance with claim 5, wherein the solder mask has a plurality of openings to completely expose the first and second contact pads including the bead receptacles.

10. The circuitized substrate in accordance with claim 5, wherein the substrate is a printed circuit board (PCB).

11. The circuitized substrate in accordance with claim 5, wherein each of the bead receptacles has a tapered opening toward the center of the corresponding first and second contact pads, the width of tapered opening is less than the diameter of the bead receptacles.

12. A semiconductor package comprising:
 a surface mount device (SMD) having a first terminal and a second terminal;
 a substrate having a surface;
 a first contact pad and a second contact pad located on the surface of the substrate, wherein the first contact pad has at least a first corner adjacent to the second contact pad, the second contact pad has at least a second corner adjacent to the first contact pad, wherein the first and second contact pad have a plurality of rounded parts formed at the first and second corners of the first and second contact pads; and
 a solder mask over the surface of the substrate; and
 a plurality of solder materials connecting the first contact pad with the first terminal of the SMD, and connecting the second contact pad with the second terminal of the SMD.

13. The package in accordance with claim 12, wherein the rounded parts have round edges which are more than one-half of a circle.

14. The package in accordance with claim 12, wherein the rounded parts have round edges which are about three-fourth of a circle.

15. The package in accordance with claim 12, wherein the solder materials include a plurality of solder beads bonded onto the rounded parts.

16. The package in accordance with claim 15, wherein the solder beads are adjacent to the SMD.

17. The package in accordance with claim 12, wherein the solder mask has a plurality of openings, each has a plurality of notches to define the rounded parts.

18. The package in accordance with claim 12, wherein the substrate is a printed circuit board (PCB).

19. The package in accordance with claim 12, wherein the SMD is a passive component selected from resistor, inductor and capacitor.

20. The package in accordance with claim 12, further comprising a chip disposed on the surface of the substrate.

21. The package in accordance with claim 20, further comprising an encapsulant sealing the chip and the SMD.

22. The package in accordance with claim 12, wherein each of the rounded parts has a tapered opening toward the center of the corresponding first and second contact pads, the width of tapered opening is less than the diameter of the rounded parts.

* * * * *